United States Patent [19]

Davis

[11] 4,351,892

[45] Sep. 28, 1982

[54] ALIGNMENT TARGET FOR ELECTRON-BEAM WRITE SYSTEM

[75] Inventor: T. Grant Davis, Sunnyvale, Calif.

[73] Assignee: Fairchild Camera & Instrument Corp., Mountain View, Calif.

[21] Appl. No.: 260,514

[22] Filed: May 4, 1981

[51] Int. Cl.³ .......................................... H01L 21/312
[52] U.S. Cl. ...................................... 430/30; 156/653; 156/657; 427/88; 427/96; 430/296; 430/314
[58] Field of Search .................... 430/296, 314, 30; 427/88, 93, 94, 96; 156/653, 657

[56] References Cited

U.S. PATENT DOCUMENTS

| | | | |
|---|---|---|---|
| 3,956,527 | 5/1976 | Magdo | 427/94 |
| 4,109,029 | 8/1978 | Ozdemir | 427/96 |
| 4,252,840 | 2/1981 | Minami | 427/88 |
| 4,272,561 | 6/1981 | Rothman | 427/88 |

OTHER PUBLICATIONS

Sakakibara et al., "Electron-Beam Direct Writing Technology for 1 Micron VLSI Fabrication" Conference:IE Devices Meeting Technical Digest, Washington, DC, (8–10 Dec., 1980).

Kim "Method of Removing Nitride Overhang Ledge by Differential Etch Technique" IBM TDB, vol. 21, No. 4, Sep. 1978.

*Primary Examiner*—John D. Smith
*Attorney, Agent, or Firm*—Kenneth Olsen; Michael J. Pollock; Theodore Scott Park

[57] ABSTRACT

An alignment target for an electron-beam direct write system is formed on a wafer of semiconductor material. First, a layer of silicon oxide is formed on a surface of the wafer. Then a layer of silicon nitride is formed on the oxide. Next, an opening is etched in the nitride layer to expose a surface portion of the oxide. The surface portion of the oxide is then etched to form a hole in the oxide. The hole is formed such that the oxide layer is undercut beneath the nitride layer such that a cantilevered nitride overhang is formed around the perimeter of the hole. A layer of aluminum is then deposited over the nitride layer.

9 Claims, 6 Drawing Figures

ALIGNMENT TARGET FOR ELECTRON-BEAM WRITE SYSTEM

TECHNICAL FIELD

This invention relates to lithographic techniques for fabricating semiconductor integrated circuits and particularly to a method for forming an alignment target on a semiconductor wafer such that the target is visible to and recognizable by an electron-beam direct wire system.

BACKGROUND ART

With the arrival of very large scale integration (VLSI) in the semiconductor industry comes the need for lithographic techniques capable of producing clean, accurate exposures on resist-covered silicon wafers with minimum line widths of less than 1 micron.

At the present time, a wide variety of lithographic techniques are available to VLSI designers. They include contact, proximity, 1:1 optical projection, step-and-repeat reduction projection, X-ray and electron-beam systems.

Contact and proximity printing are the oldest types of lithographic systems available. In contact printing, a glass mask bearing an emulsion or chromium-film pattern is first aligned with reference points (alignment targets) on a resist-coated semiconductor wafer. Then the mask is pressed directly onto the wafer and exposed to ultraviolet light. In proximity printing, a gap of several microns divides the mask from the wafer.

The resolution of contact printing is limited only by the wave length of ultraviolet light used, so that 1 micron lines can easily be printed using this technique. Proximity printing has a slightly lower resolution which varies with the gap size. However, the yield of chips made with either contact or proximity printing is extremely low due to the mask damage and wafer contamination caused by contact between the mask and the wafer. Because of the poor yield, these techniques are gradually being phased out.

Optical projection techniques may be divided into two types. In 1:1 reflective optical systems, a complex reflective lens system uses a mask to project an image the same size as the mask onto the wafer. Because it does not touch the wafer and therefore cannot damage it, the mask can be made of a hard material such as chrome. Thus, 1:1 optical projection systems can achieve extremely high yields thereby eliminating the major drawback of contact and proximity printing. The primary problem associated with 1:1 projection, however, is the fact that if a wafer is distorted in processing, it will cause layer-to-layer registration of successive masks to be out of specification, reducing yield. Another drawback of 1:1 projection is the fact that line widths of only about 3 microns are obtainable.

In an effort to eliminate the shortcomings of 1:1 projection systems, step-and-repeat reduction projection systems utilize a smaller projection area. A UV light source is shown through a blown-up portion of a wafer pattern, commonly known as a reticle. The reticle's pattern is projected down through a reduction lens onto the surface of a resist-covered wafer. After exposure, the lens is mechanically stepped to a new sight for another exposure. This procedure is repeated until the reticle image is projected across the entire wafer surface. While step-and-repeat systems can achieve 1.5 micron line widths, they are much more costly than 1:1 projection systems. They also have an inherently lower through-put since they require many exposures rather than just one.

X-ray lithography is a form of contact printing in which an X-ray source replaces the UV source. Resists specifically designed for X-ray exposure are utilized. X-ray lithography can produce line widths of 0.5 to 2 microns. The masks, however, which must be opaque to X-rays, are made of gold deposited on a layer of silicon, Mylar or polyimide only 2–10 microns thick. Thus, they are very fragile. Other problems associated with X-ray techniques are distortion caused by ripples in processed wafers and lack of standardization in mask design.

Until recently, scanning electron-beam lithography has been utilized primarily in making masks and reticles for use in the above-described systems. However, as VLSI design rules move into the sub-micron range, direct writing on the wafer with an electron beam is becoming more prominent. According to this technique, a computer-controlled electron beam scans a pattern with extremely high resolution and accuracy across a resist-covered semiconductor wafer.

Three major advantages of such direct write scanning electron-beam systems are its 0.2-to-1 micron resolution, its ability to align a pattern to within 0.05 microns and its ability to correct for wafer distortion.

In each of the above-described lithographic systems except electron-beam direct write, an optical mask must be registered with the wafer. That is, the mask image must be accurately aligned with the wafer so that the pattern created by the exposure is properly positioned on the wafer. To accomplish this, a reference target formed on the mask is matched with an alignment target formed on the wafer. This matching is done either manually or automatically using through-the-lens techniques.

In an electron-beam writing system, the mask pattern is represented by data which is embodied in the software of the system. When the system is utilized to pattern masks, no alignment targets are required since the pattern is formed on a plate which is initially bare. The resulting mask may then be properly aligned with an underlying wafer. However, when the system is utilized for writing a pattern directly onto a wafer, it first must be registered with the die pattern which exists on the wafer.

To accomplish this alignment, the electron-beam system executes a low energy scan to locate an alignment target which has been formed on the wafer. The system is programmed to locate the alignment target by recognizing a specific predetermined wave-form pattern which is characteristic of the target. A number of targets may be utilized for rotational or other alignment adjustments. After the electron-beam system has recognized the target and is registered with the wafer, the system executes a high energy scan according to its software instruction set to pattern the wafer.

The edges of the alignment target must present a clear, high resolution image to the electron-beam system so that the system may be registered with the extreme accuracy required for producing sub-micron line widths. Furthermore, as stated above, the electron-beam system must be able to recognize a particular alignment target which is defined in the system software.

One type of alignment target utilized in electron-beam direct write systems is a recess of a particular geometry, typically a square or a rectangle, which is cut into the surface of the wafer and has steeply-sloped sidewalls. Steeply-sloped sidewalls are preferable to vertical sidewalls because sloped sidewalls provide some width to the edge of the target as the wafer is scanned from directly above by the electron-beam system. However, utilization of sloped sidewalls results in loss of resolution.

DISCLOSURE OF THE INVENTION

The present invention provides a method for forming a high resolution, alignment target for an electron-beam direct write system on a wafer of semiconductor material. According to the method, a layer of silicon oxide is formed on a surface of the semiconductor wafer. A layer of silicon nitride is then formed on the oxide layer. Next, an opening is etched in the nitride layer to expose a portion of the surface of the oxide layer. The exposed surface portion of the oxide layer is then etched to form a hole in the oxide layer. The hole in the oxide layer is formed such that the oxide is undercut beneath the overlying nitride layer such that a cantilevered nitride overhang is created around the perimeter of the hole. Finally, aliminum is deposited over the nitride layer. According to a preferred embodiment, aluminum is deposited over the nitride layer and in the hole such that a continuous gap exists between the edge of the nitride overhang and the aluminum in the hole.

BEST MODE FOR CARRYING OUT THE INVENTION

Figure 1:
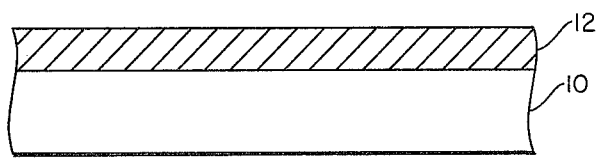
FIG. 1 shows a cross-sectional view of a portion of a wafer of semiconductor material having a layer of silicon oxide formed thereon.

FIG. 1 shows a portion of a wafer 10 of semiconductor material, preferably silicon, having a layer 12 of silicon oxide about 0.9–1.5 microns, typically about 1.45 microns, thick formed thereon. The oxide layer is formed according to conventional techniques.

Figure 2:
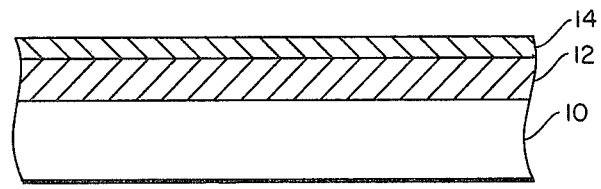
FIG. 2 shows the structure of FIG. 1 having a layer of silicon nitride formed on the oxide layer.

As shown in FIG. 2, a layer 14 of silicon nitride typically about 700 Angstroms thick is formed on the oxide layer 12. The nitride layer 14 is deposited by conventional techniques, preferably by low pressure chemical vapor deposition.

Figure 3:
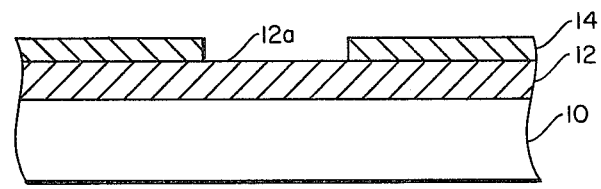
FIG. 3 shows the structure of FIG. 2 after an opening has been etched in the nitride layer to expose a surface portion of the oxide layer.

Next, as shown in FIG. 3, wet etch techniques are utilized to remove a portion of the nitride layer 14 to expose a rectangular surface portion 12a of the oxide layer 12.

Figure 4:
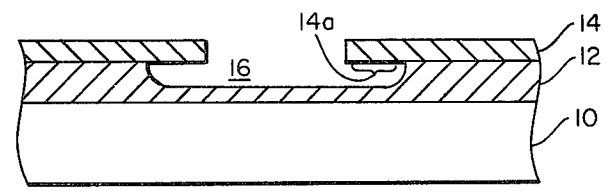
FIG. 4 shows the structure of FIG. 3 after a hole has been formed in the oxide layer.

The oxide layer 12 underlying the surface portion 12a is then etched by conventional oxide etch techniques to form a hole 16 in the oxide layer 12. As shown in FIG. 4, the hole 16 is formed such that the nitride layer 14 is undercut such that a cantilevered nitride overhang 14a, preferably about 2 microns wide, is formed around the perimeter of the hole 16.

Figure 5:
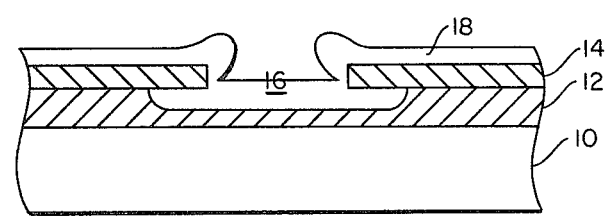
FIG. 5 shows the structure of FIG. 4 following the deposition of a layer of aluminum.
Figure 6:
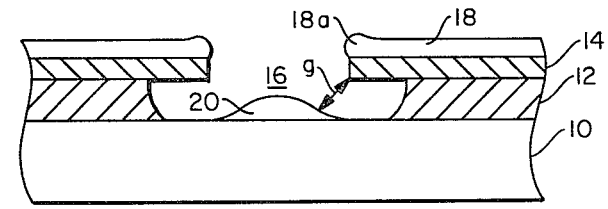
FIG. 6 shows an cross-sectional view of a preferred structure of the alignment target of the present invention.

Finally, as shown in FIG. 5, a layer 18 of aluminum about 0.70–1.0 microns thick is deposited over the nitride layer 14 and, preferably, in the hole 16 to complete the target. According to a preferred embodiment of the present invention illustrated in FIG. 6, the hole 16 is etched to the surface of the wafer 10. Furthermore, in the preferred embodiment, the aluminum layer 18 is deposited over the nitride layer 14 and in the hole 16 such that a continuous gap g exists between the nitride overhang 14a and the aluminum mound 20 which is formed in the hole 16.

The electron-beam direct write system is then registered with the wafer as in scans the wafer and recognizes the specific predetermined wave-form pattern associated with the target.

It is believed that deposition of aluminum over the cantilevered nitride overhang provides a sharply defined edge to the alignment target which is easily and accurately recognized by the direct write system. For example, referring to the preferred embodiment illustrated in FIG. 6, it is believed that when a scanning electron beam is directed into the hole 16, electrons are trapped beneath the nitride overhang 14a such that the perimeter edge 18a of the aluminum layer 18 formed on the nitride overhang 14a presents a precisely defined edge to the direct write system. The edge then serves as a highly accurate reference for the alignment of the electron-beam system with sufficient precision for subsequent submicron patterning of the wafer.

While the general shape of the alignment target disclosed herein is not critical to the invention and may include either curved or straight-line edges or both, it is believed that holes 16 with straight-line edges such as rectangles, squares, lettering and the like provide more accurately recognizable targets than do holes with curved edges.

I claim:

1. A method for aligning an electron beam of an electron-beam direct write system with a wafer of semiconductor material, comprising:
   (a) forming an alignment target on the wafer by the steps of
      (i) forming a layer of silicon oxide on a surface of said wafer;
      (ii) forming a layer of silicon nitride on said oxide layer;
      (iii) etching an opening in said nitride layer to expose a surface portion of said oxide layer;
      (iv) etching said exposed surface portion to form a hole in said oxide layer, said hole being formed such that said oxide layer is undercut beneath said silicon nitride layer such that a cantilevered silicon nitride overhang is formed around the perimeter of said hole; and
      (v) depositing a layer of aluminum over said nitride layer;
   (b) scanning the surface of the wafer with the electron beam; and
   (c) detecting the alignment of the electron beam with the alignment target.

2. The method of claim 1 wherein said aluminum layer is deposited over said nitride layer and in said hole such that a continuous gap exists between said nitride overhang and said aluminum in said hole.

3. The method of claim 1 wherein said hole is rectangular in horizontal cross-section.

4. The method of claim 1 wherein said hole is square in horizontal cross-section.

5. The method of claim 1 wherein said hole extends to the surface of said wafer.

6. The method of claim 1 wherein said silicon oxide layer is about 1.45 microns thick.

7. The method of claim 6 wherein said silicon nitride layer is about 700 Angstroms thick.

8. The method of claim 7 wherein said nitride overhang is about 2 microns wide.

9. The method of claim 8 wherein said aluminum layer is about 0.70–1.0 microns thick.

* * * * *